United States Patent
Gao et al.

(10) Patent No.: US 11,296,168 B2
(45) Date of Patent: Apr. 5, 2022

(54) DISPLAY PANEL COMPRISING AT LEAST THREE SUB-PIXEL REGIONS FOR EACH SUB-PIXEL AND DISPLAY DEVICE HAVING THE SAME

(71) Applicant: SHENZHEN CHINA STAR OPTOELECTRONICS SEMICONDUCTOR DISPLAY TECHNOLOGY CO., LTD., Shenzhen (CN)

(72) Inventors: Kuo Gao, Shenzhen (CN); Baixiang Han, Shenzhen (CN)

(*) Notice: Subject to any disclaimer, the term of this patent is extended or adjusted under 35 U.S.C. 154(b) by 226 days.

(21) Appl. No.: 16/618,397

(22) PCT Filed: Nov. 4, 2019

(86) PCT No.: PCT/CN2019/115330
§ 371 (c)(1),
(2) Date: Dec. 2, 2019

(87) PCT Pub. No.: WO2020/244137
PCT Pub. Date: Dec. 10, 2020

(65) Prior Publication Data
US 2021/0359054 A1    Nov. 18, 2021

(30) Foreign Application Priority Data

Jun. 3, 2019  (CN) .......................... 201910474694.5

(51) Int. Cl.
*H01L 29/08*   (2006.01)
*H01L 27/32*   (2006.01)

(52) U.S. Cl.
CPC ...... *H01L 27/3262* (2013.01); *H01L 27/3265* (2013.01); *H01L 27/3272* (2013.01); *H01L 27/3276* (2013.01)

(58) Field of Classification Search
CPC ............. H01L 27/3262; H01L 27/3265; H01L 27/3272; H01L 27/3276
USPC .......................................................... 257/40
See application file for complete search history.

(56) References Cited

U.S. PATENT DOCUMENTS

| | | | |
|---|---|---|---|
| 2009/0086146 A1* | 4/2009 | Wakabayashi | G02F 1/134363 349/141 |
| 2009/0179556 A1* | 7/2009 | Kim | H01L 51/5008 313/504 |
| 2015/0109188 A1* | 4/2015 | Huang | G09G 3/3225 345/77 |
| 2019/0189055 A1* | 6/2019 | Zhang | H01L 27/32 |

* cited by examiner

Primary Examiner — Phuc T Dang

(57) ABSTRACT

The present invention provides a display panel. The display panel includes at least three sub-pixel regions. The sub-pixel regions are arranged along a direction of a scan line. A channel region of each driving TFT in the same sub-pixel region has a same width-to-length ratio. Along a direction from a signal input end to a signal output end of the scan line, the width-to-length ratio of the channel region of each driving TFT of any of the sub-pixel regions is smaller than that of a previous one of the sub-pixel regions.

20 Claims, 3 Drawing Sheets

DISPLAY PANEL COMPRISING AT LEAST THREE SUB-PIXEL REGIONS FOR EACH SUB-PIXEL AND DISPLAY DEVICE HAVING THE SAME

FIELD OF THE DISCLOSURE

The present invention relates to a field of display devices and in particular, to a display panel and a display device.

DESCRIPTION OF THE RELATED ART

Organic light-emitting diode (OLED) display device has advantages such as being self-luminous, low driving voltage, high luminous efficiency, short response time, a high resolution, a high contrast ratio, an approximately 180° viewing angle, operation in a wide temperature range, flexible display, and a full-color large display, so OLED displays have been considered as the most promising display panel.

The display panel has a plurality of sub-pixels. The sub-pixels which have a same color and are in different positions are provided with driving TFTs of a same size. When driven from a single side, due to the influence of resistance and capacitance in each line of the sub-pixel circuits, a current of a sub-pixel circuit is fed back to a scan signal line after the scan signal line of each row passes through a sub-pixel circuit, which will inevitably affect a current magnitude of a next sub-pixel circuit connected to the scan circuit, thus causing currents of the sub-pixels in the display panel to gradually increase from left to right, leading to uneven brightness of the OLED. As a result, when the display panel is larger in size, and uneven brightness of the OLED in the sub-pixels at different positions is more obvious. Especially, since a difference between current magnitudes in low grayscales is more obvious, the display quality of the entire display panel is affected.

In summary, a load capacitor and a storage capacitor in the sub-pixel circuit of a prior art cause the current of the sub-pixels in the panel to gradually increase along a direction from a signal input end to a signal output end of the scan line, resulting in uneven brightness of the OLED. When the display panel is larger in size, uneven brightness of the OLED of the sub-pixels at different positions is more obvious. Especially, a difference between current magnitudes is more obvious in low grayscales, which affects the display quality of the entire display panel.

SUMMARY

The present invention aims to provide a display panel and a display device. In prior arts, a load capacitor and a storage capacitor in a sub-pixel circuit cause currents of the sub-pixels in a display panel to gradually increase along a direction from a signal input end to a signal output end of a scan line, resulting in uneven brightness of an OLED. When the display panel is larger in size, uneven brightness of the OLED of the sub-pixels at different positions is more obvious. Especially, a difference between current magnitudes is more obvious in low grayscales, which affects the display quality of the entire display panel.

Accordingly, the present invention provides a display panel, comprising:

at least three sub-pixel regions, wherein the sub-pixel regions are arranged along a direction of a scan line, the sub-pixel regions comprise a plurality of sub-pixels arranged in an array pattern, and each of the sub-pixels comprises at least one driving thin-film-transistor (TFT); and wherein a channel region of each driving TFT in the same sub-pixel region has a same width-to-length ratio; and along a direction from a signal input end to a signal output end of the scan line, the width-to-length ratio of the channel region of each driving TFT of any of the sub-pixel regions is smaller than that of a previous one of the sub-pixel regions.

According to one embodiment of the present invention, the sub-pixel regions are equidistant along the direction of the scan line and a direction of a data line in the display panel.

According to one embodiment of the present invention, a shape of each sub-pixel region includes one or more of a rectangle, a parallelogram, a diamond, a triangle, a polygon, and an irregular planar pattern; and a shielding structure for preventing interference of signals is provided between each two adjacent ones of the sub-pixel regions.

According to one embodiment of the present invention, each of the sub-pixel regions has a same number of sub-pixels.

According to one embodiment of the present invention, each of the sub-pixels of a same color in each of the sub-pixel regions has a same number of driving TFTs.

According to one embodiment of the present invention, the channel region of each driving TFT of the sub-pixels of a same color in the sub-pixel regions along a direction of a same data line has the same width-to-length ratio.

According to one embodiment of the present invention, the channel region of each driving TFT of the sub-pixels of a same color in the sub-pixel regions along a direction of a same scan line has a gradually decreased width and a same length.

According to one embodiment of the present invention, pixel circuits disposed corresponding to each line of the arrayed sub-pixels are sequentially connected in series, and the pixel circuits disposed corresponding to each two adjacent lines of the sub-pixels are connected in parallel.

According to one embodiment of the present invention, the sub-pixels include a switching TFT, the driving TFT, a detecting TFT, a storage capacitor, and an organic light-emitting diode, and a detection voltage connected to the detecting TFT is a constant voltage.

According to one embodiment of the present invention, a scan voltage is applied to each of the sub-pixels of a same row through a same scan signal line; and a data voltage is applied to each of the sub-pixels of a same column through a same data signal line.

Accordingly, the present invention further provides a display device, comprising:

a display panel, wherein the display panel comprises:

at least three sub-pixel regions, wherein the sub-pixel regions are arranged along a direction of a scan line, the sub-pixel regions comprise a plurality of sub-pixels arranged in an array pattern, and each of the sub-pixels comprises at least one driving thin-film-transistor (TFT); and wherein a channel region of each driving TFT in the same sub-pixel region has a same width-to-length ratio; and along a direction from a signal input end to a signal output end of the scan line, the width-to-length ratio of the channel region of each driving TFT of any of the sub-pixel regions is smaller than that of a previous one of the sub-pixel regions.

According to one embodiment of the present invention, the sub-pixel regions are equidistant along the direction of the scan line and a direction of a data line in the display panel.

According to one embodiment of the present invention, each sub-pixel region comprises one or more of a rectangle, a parallelogram, a diamond, a triangle, a polygon, or an irregular planar pattern; and a shielding structure for preventing interference of signals is provided between each two adjacent ones of the sub-pixel regions.

According to one embodiment of the present invention, each of the sub-pixel regions has a same number of sub-pixels.

According to one embodiment of the present invention, the sub-pixels of a same color in each of the sub-pixel regions has a same number of driving TFTs.

According to one embodiment of the present invention, the channel region of each driving TFT of the sub-pixels of a same color in the sub-pixel regions along a direction of a same data line has the same width-to-length ratio.

According to one embodiment of the present invention, the channel region of each driving TFT of the sub-pixels of a same color in the sub-pixel regions along a direction of a same scan line has a gradually decreased width and a same length.

According to one embodiment of the present invention, pixel circuits disposed corresponding to each line of the arrayed sub-pixels are sequentially connected in series, and the pixel circuits disposed corresponding to each two adjacent lines of the sub-pixels are connected in parallel.

According to one embodiment of the present invention, the sub-pixels include a switching TFT, the driving TFT, a detecting TFT, a storage capacitor, and an organic light-emitting diode, and a detection voltage connected to the detecting TFT is a constant voltage.

According to one embodiment of the present invention, a scan voltage is applied to each of the sub-pixels of a same row through a same scan signal line; and a data voltage is applied to each of the sub-pixels of a same column through a same data signal line.

Advantages of the present invention: The display panel is provided with multiple sub-pixel regions. A size of the channel region of each driving TFT in the sub-pixel regions is decreased along the direction of a scan voltage. Therefore, currents provided by the driving TFTs are close in magnitude. Such configuration ensures uniform brightness of the OLED in the sub-pixel circuits and improve uniform display quality of the display panel.

BRIEF DESCRIPTION OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, a person having ordinary skill in this field can obtain other figures according to these figures without an inventive work or paying the premise.

DETAILED DESCRIPTION OF THE EMBODIMENTS

Embodiments of the present disclosure are described in detail with reference to the accompanying drawings as follows. Directional terms such as up/down, right/left and the like may be used for the purpose of enhancing a reader's understanding about the accompanying drawings, but are not intended to be limiting. Specifically, the terminologies in the embodiments of the present disclosure are merely for the purpose of describing certain embodiments, but not intended to limit the scope of the invention. The same reference numbers are used throughout the drawings to refer to the same or similar parts.

In prior arts, load and storage capacitors in a sub-pixel circuit cause a current of sub-pixels in a display panel to gradually increase along a direction from a signal input end to a signal output end of a scan line, resulting in uneven brightness of an organic light-emitting diode (OLED). As a result, when the display panel is larger in size, uneven brightness of the organic light-emitting diode is more obvious in different sub-pixel regions. Especially, a current difference between the sub-pixels in 32-grayscale is more obvious, thereby affecting display quality of the display panel. The present invention can solve the problem.

Figure 1:
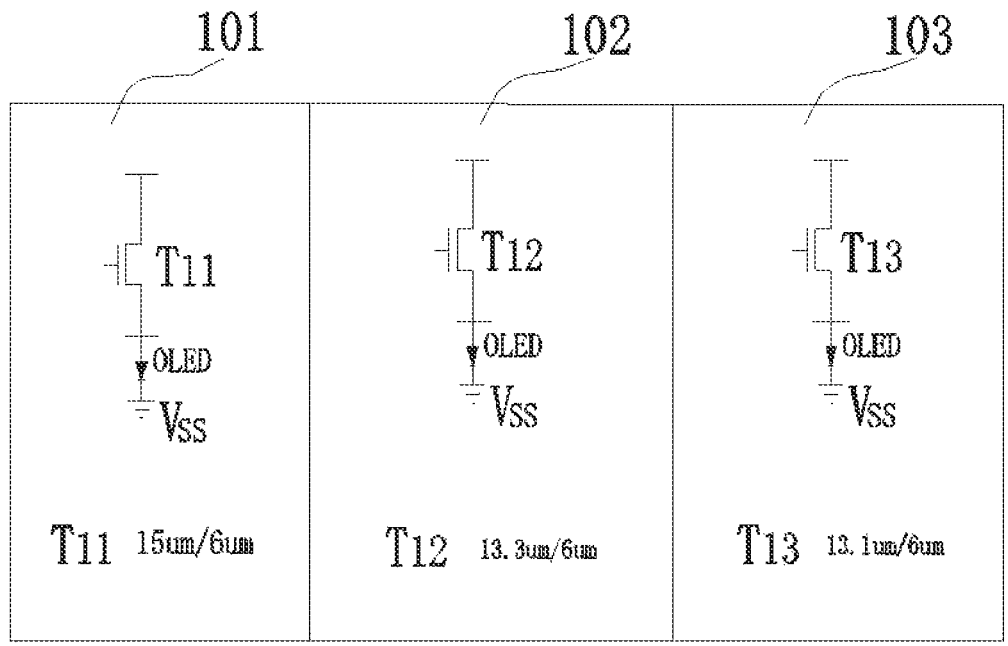
FIG. 1 is a schematic structural view illustrating a display panel according to one embodiment of the present invention.

Referring to FIG. 1, the present invention provides a display panel, comprising:

at least three sub-pixel regions, wherein the sub-pixel regions are arranged along a direction of a scan line, the sub-pixel regions comprise a plurality of sub-pixels arranged in an array pattern, and each of the sub-pixels comprises at least one driving thin-film-transistor (TFT). In the present embodiment, the sub-pixel region 101, the sub-pixel region 102, and the sub-pixel region 103 are distributed along the direction of the scan line, and have the same amount of area. Each of the sub-pixel region 101, the sub-pixel region 102, and the sub-pixel region 103 includes multiple driving TFTs.

A channel region of each driving TFT in the same sub-pixel region has a same width-to-length ratio. Along a direction from a signal input end to a signal output end of the scan line, the width-to-length ratio of the channel region of each driving TFT of any of the sub-pixel regions is smaller than that of a previous one of the sub-pixel regions. According to the present embodiment of the display panel, the width-to-length ratio T11 of each driving TFT of the sub-pixel region 101 is 15 µm/6 µm, and the width-to-length ratio T12 of each driving TFT of the sub-pixel region 102 is 13.3 µm/6 µm, and the width-to-length ratio T13 of each driving TFT of the sub-pixel region 103 is 13.1 µm/6 µm.

The sub-pixel regions are equidistant along the direction of the scan line and a direction of a data line in the display panel. A shape of each sub-pixel region includes one or more of a rectangle, a parallelogram, a diamond, a triangle, a polygon, and an irregular planar pattern. A shielding structure for preventing interference of signals is provided between each two adjacent ones of the sub-pixel regions. The shielding structure is a metal piece. The number of sub-pixels in each sub-pixel region is preferably the same.

Each of the sub-pixels of a same color in each of the sub-pixel regions has a same number of driving TFTs. The channel region of each driving TFT of the sub-pixels of a same color in the sub-pixel regions along a direction of a same data line has the same width-to-length ratio.

The channel region of each driving TFT of the sub-pixels of a same color in the sub-pixel regions along a direction of a same scan line has a gradually decreased width and a same length.

A scan voltage is applied to each sub-pixel of the same row through a same scan signal line. A data voltage is applied to each sub-pixel of a same column through a same data signal line.

Figure 2:
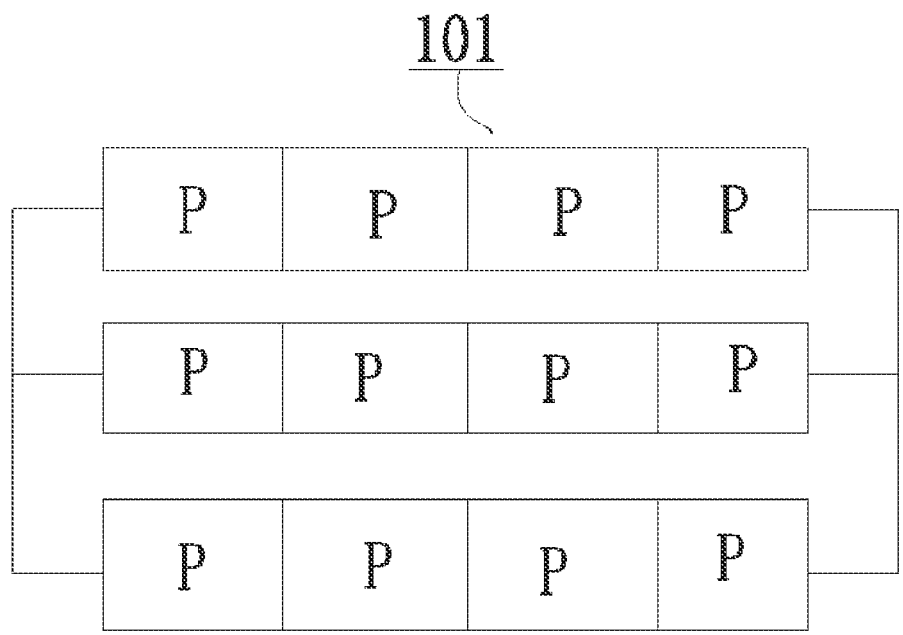
FIG. 2 is a schematic structural view illustrating a sub-pixel region according to one embodiment of the present invention.

As shown in FIG. 2, pixel circuits disposed corresponding to each line of the arrayed sub-pixels P are sequentially connected in series, and the pixel circuits disposed corresponding to each two adjacent lines of the sub-pixels are connected in parallel. In the present embodiment, the sub-pixel region 101 has a 4×3 sub-pixel array. Each line of the 4×3 sub-pixel array has 4 sub-pixels connected in series, the 4×3 sub-pixel array has three lines of the sub-pixels, and each adjacent two lines of the sub-pixels are connected in parallel.

Figure 3:
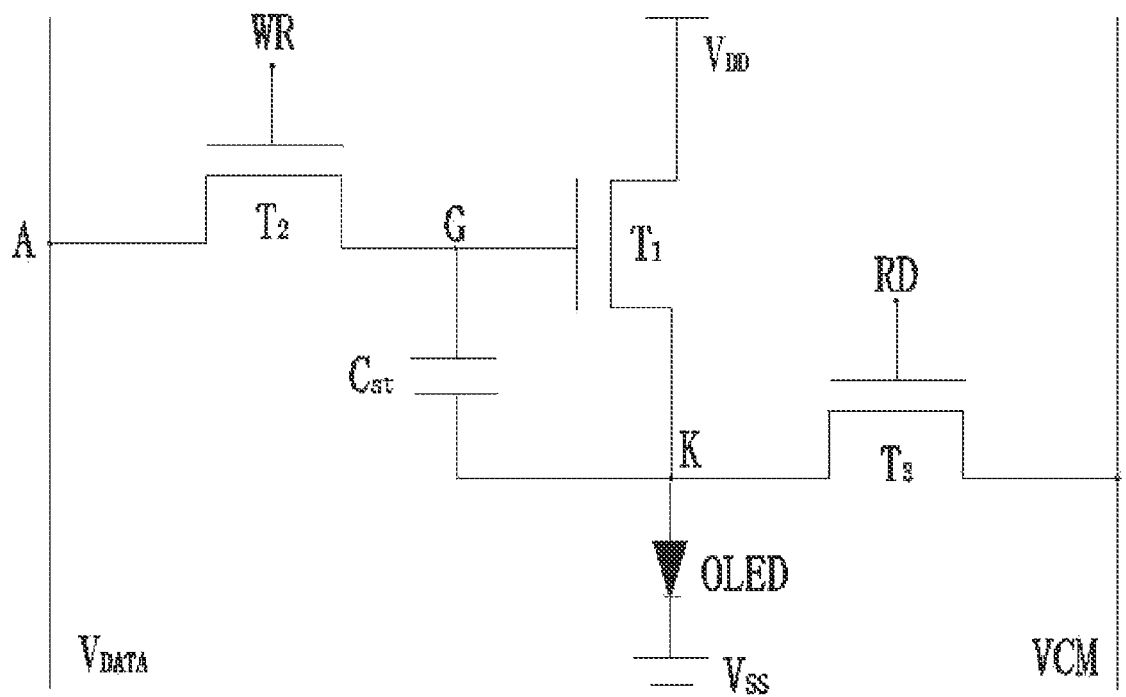
FIG. 3 is a schematic view illustrating a pixel circuit according to one embodiment of the present invention.

Referring to FIG. 3, the sub-pixel comprises a first TFT T1, a second TFT T2, a third TFT T3, a storage capacitor Cst, and an organic light-emitting diode (OLED). The first TFT T1 is the driving TFT, the second TFT T2 is a switching TFT, and the third TFT T3 is a detecting TFT. The driving TFT, the switching TFT, and the detecting TFT are low temperature polysilicon TFTs, oxide semiconductor TFTs, or amorphous silicon TFTs.

In the pixel circuit, a gate electrode of the second TFT T2 is electrically connected to a scan voltage signal line, a source electrode of the second TFT T2 is electrically connected to a data voltage signal line, and a drain electrode of the second TFT T2 is electrically connected to a gate electrode of the first TFT T1 and one end of the storage capacitor Cst. A source electrode of the first TFT T1 is electrically connected to a positive voltage of a power supply, and a drain electrode of the first TFT T1 is electrically connected to an anode of the OLED. A cathode of the OLED is electrically connected to a negative voltage of the power supply. One end of the storage capacitor Cst is electrically connected to the drain electrode of the second TFT T2 and the gate electrode of the first TFT T1, and the other end of the storage capacitor Cst is electrically connected to the drain electrode of the first TFT T1, the anode of the OLED, and a source electrode of the third TFT T3. A gate electrode of the third TFT T3 is electrically connected to a data signal, the source electrode of the third TFT T3 is electrically connected to the drain electrode of the first TFT T1, and the drain electrode of the third TFT T3 is connected to a detection voltage. It is a constant voltage (VCM) that the drain electrode of the third TFT T3 is connected to.

During a reset period of the pixel circuit, a scan voltage and data of the pixel circuit in each sub-pixel region are respectively applied to the gate electrode and the source electrode of the second TFT T2 in the pixel circuit. During a data writing period of the pixel circuit, the third switching TFT T3 in the pixel circuit is turned on to apply a data voltage to the drain electrode of the first TFT T1. During a light emitting period of the pixel circuit, the first TFT T1 is turned on, so that the OLED connected to the drain electrode of the first TFT emits light.

Figure 4:
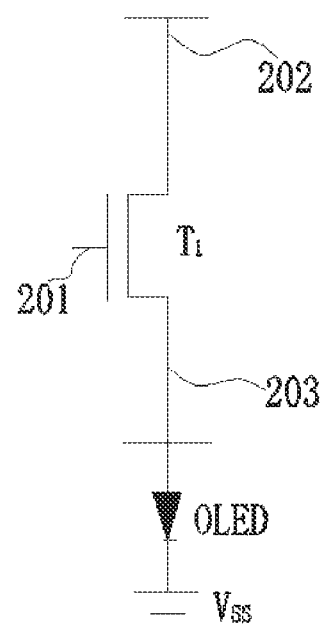
FIG. 4 is a schematic view illustrating a driving thin-film-transistor according to one embodiment of the present invention.

As shown in FIG. 4, the driving TFT T1 at least comprises the gate electrode 201, the source electrode 202, the drain electrode 203, and an active layer. The active layer comprises a channel region between the source electrode and the drain electrode. As a width-to-length ratio of the channel region is decreased, an on-state current of the corresponding driving TFT is lowered. The larger the current supplied to the OLED by the driving TFT T1, the greater the brightness of the OLED. On the contrary, the smaller the current supplied to the OLED by the driving TFT T1, the smaller the brightness of the OLED.

The present invention provides a display panel according to one embodiment of the present invention. The display panel has multiple sub-pixel regions. A channel region of each driving TFT in the same sub-pixel region has a same width-to-length ratio. Along a direction from a signal input end to a signal output end of a scan line, the width-to-length ratio of the channel region of each driving TFT of any of the sub-pixel regions is smaller than that of a previous one of the sub-pixel regions. Such configuration can significantly improve low grayscale current uniformity of sub-pixels, and ensure that low grayscale current uniformity of the sub-pixels in different sub-pixel regions is 90% or higher.

The applicant uses a control variable method. The present invention provides a display panel. In the sub-pixel region 101 of the display panel, the width-to-length ratio of each driving TFT is 15 μm/6 μm, and the width-to-length ratio of each driving TFT in the sub-pixel region 102 are 13.3 μm/6 μm, the width-to-length ratio of each driving TFT in the sub-pixel region 103 is 13.1 μm/6 μm. In an example of a conventional display panel, a width-to-length ratio of each driving TFT in a sub-pixel region 301, a sub-pixel region 302, and a sub-pixel partition 303 is 15 μm/6 μm. In the two kinds of display panels, the width-to-length ratios of the driving TFTs are different in different sub-pixel regions, but other conditions are the same. Two experiments are performed. Light-emission uniformity of an OLED in the corresponding sub-pixel region is evaluated by obtaining current magnitudes corresponding to low grayscales in the sub-pixel region 301, the sub-pixel region 302, and the sub-pixel region 303 of the conventional display panel. Moreover, by obtaining current magnitudes corresponding to low grayscales in the sub-pixel region 101, the sub-pixel region 102, and the sub-pixel region 103 of the display panel, light-emission uniformity of the OLED in the corresponding sub-pixel regions are evaluated, as shown in TABLE 1.

TABLE 1 compares the conventional display panel with the display panel of the present embodiment and shows current magnitude and current uniformity of the display panels in different grayscales.

| | Conventional Display Panel | | | | | |
|---|---|---|---|---|---|---|
| Position | 301 | 302 | 303 | 301 | 302 | 303 |
| TFT Width to Length Ratio | 15 μm/ 6 μm | 15 μm/ 6 μm | 15 μm/ 6 μm | 15 μm/ 6 μm | 15 μm/ 6 μm | 15 μm/ 6 μm |
| 255 | 2.5283 μA | 2.5377 μA | 2.5454 μA | 100% | 99.63% | 99.32% |
| 128 | 542.25 nA | 558 nA | 560.93 nA | 100% | 97.10% | 96.56% |
| 64 | 123.3 nA | 135.85 nA | 140.09 nA | 100% | 89.82% | 86.38% |

-continued

| | | | | | | |
|---|---|---|---|---|---|---|
| 32 | 30.217 nA | 36.835 nA | 37.379 nA | 100% | 78.10% | 76.30% |

Display Panel of Present Embodiment

| Position | 101 | 102 | 103 | 101 | 102 | 103 |
|---|---|---|---|---|---|---|
| TFT Width to Length Ratio | 15 μm/ 6 μm | 13.3 μm/ 6 μm | 13.1 μm/ 6 μm | 15 μm/ 6 μm | 13.3 μm/ 6 μm | 13.1 μm/ 6 μm |
| 255 | 2.5283 μA | 2.301 μA | 2.2798 μA | 100% | 91.01% | 90.17% |
| 128 | 542.25 nA | 501.96 nA | 497.96 nA | 100% | 92.57% | 91.83% |
| 64 | 123.3 nA | 122.31 nA | 124.39 nA | 100% | 99.20% | 90.17% |
| 32 | 30.217 nA | 33.122 nA | 33.167 nA | 100% | 90.39% | 90.24% |

Figure 5:
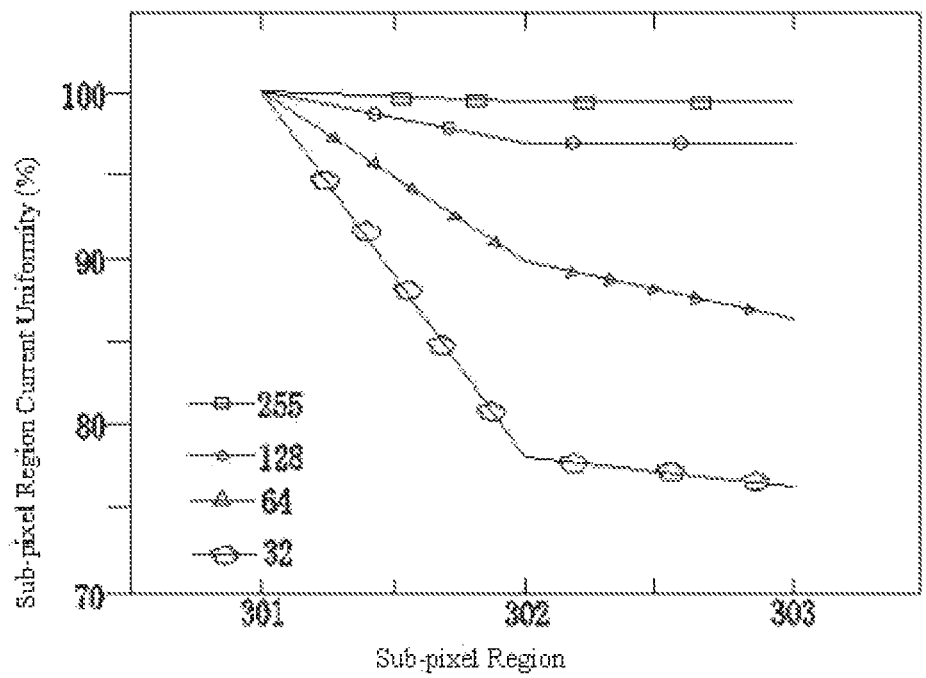
FIG. 5 is a schematic view illustrating sub-pixel region current uniformity in different sub-pixel regions of a conventional display panel.
Figure 6:
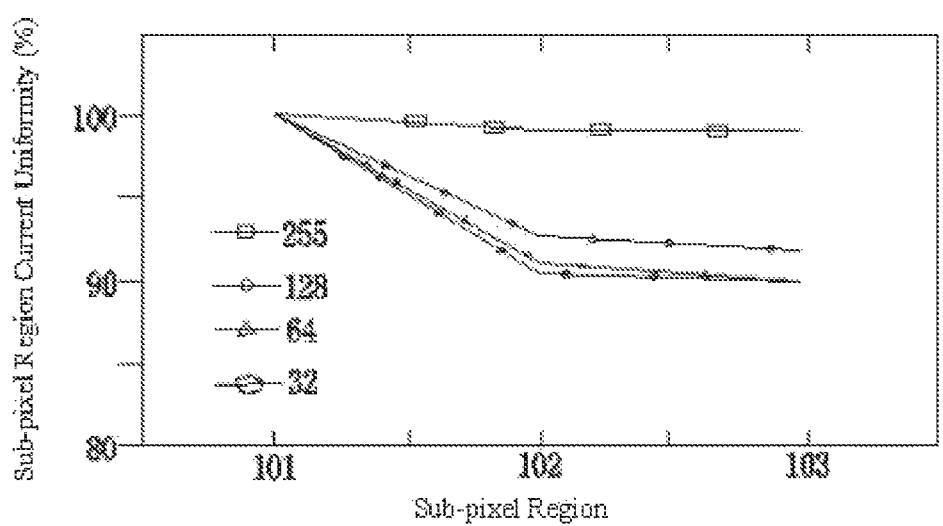
FIG. 6 is a schematic view illustrating sub-pixel region current uniformity in different sub-pixel regions of the display panel of the present invention.

FIG. 5 and FIG. 6 are produced by selecting from Table 1 the current uniformity of the sub-pixels corresponding to different grayscales in different pixel regions of the conventional display panel and the display panel of the present invention. FIG. 5 is a schematic diagram showing sub-pixel region current uniformity in different sub-pixel regions of the conventional display panel, wherein an abscissa axis indicates the sub-pixel regions, and an ordinate axis indicates sub-pixel region current uniformity. Display uniformity of the conventional display panel is reduced, as the grayscale value decreases. In particular, in the sub-pixel region 303 corresponding to 32-grayscale, the current uniformity has been reduced to 76.30%, so the OLED display has non-uniform brightness in the sub-pixel region 303, thus directly affecting display quality of the conventional display panel. FIG. 6 is a schematic diagram showing sub-pixel region current uniformity in different sub-pixel regions of the display panel of the present invention, wherein an abscissa axis indicates the sub-pixel regions, and an ordinate axis indicates sub-pixel region current uniformity. By adjusting the width-to-length ratio of the channel region of the driving TFT in the sub-pixel region 102 and the sub-pixel region 103, the current uniformity corresponding to low grayscales can be significantly improved, and the sub-pixel current uniformity of the sub-pixel region 103 corresponding to 32-grayscale is increased from 76.30% to 90.24%, thus significantly improving the brightness of the OLED in the sub-pixel region 103.

Comparing FIG. 5 with FIG. 6, a channel region of each driving TFT in the same sub-pixel region of the display panel has a same width-to-length ratio. Along a direction from a signal input end to a signal output end of the scan line, the width-to-length ratio of the channel region of each driving TFT of any of the sub-pixel regions is smaller than that of a previous one of the sub-pixel regions. This configuration can ensure that the current uniformity corresponding to grayscales of 255, 128, 63, and 32 in different sub-pixel regions is 90% or more, and display quality of the display panel is improved.

According to the above objectives, the present invention provides a display device which has the display panel of the above embodiment.

The display panel comprises at least three sub-pixel regions. The sub-pixel regions are arranged along a direction of a scan line, the sub-pixel regions comprise a plurality of sub-pixels arranged in an array pattern, and each of the sub-pixels comprises at least one driving thin-film-transistor (TFT).

A channel region of each driving TFT in the same sub-pixel region has a same width-to-length ratio; and along a direction from a signal input end to a signal output end of the scan line, the width to length ratio of the channel region of each driving TFT of any of the sub-pixel regions is smaller than that of a previous one of the sub-pixel regions.

In the present invention, the display panel is provided with multiple sub-pixel regions, and the width-to-length ratio of the channel region of each driving TFT in different sub-pixel regions are gradually decreased along a scan voltage direction, and currents supplied by the driving TFTs to the OLEDs are close in magnitude. Such configuration ensures that the brightness of the OLEDs in the sub-pixel circuit is uniform, thus improving display uniformity of the display panel.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A display panel, comprising:
   at least three sub-pixel regions, wherein the sub-pixel regions are arranged along a direction of a scan line, the sub-pixel regions comprise a plurality of sub-pixels arranged in an array pattern, and each of the sub-pixels comprises at least one driving thin-film-transistor (TFT); and
   wherein a channel region of each driving TFT in the same sub-pixel region has a same width-to-length ratio; and along a direction from a signal input end to a signal output end of the scan line, the width-to-length ratio of the channel region of each driving TFT of any of the sub-pixel regions is smaller than that of a previous one of the sub-pixel regions.

2. The display panel according to claim 1, wherein the sub-pixel regions are equidistant along the direction of the scan line and a direction of a data line in the display panel.

3. The display panel according to claim 1, wherein a shape of each sub-pixel region includes one or more of a rectangle, a parallelogram, a diamond, a triangle, a polygon, and an irregular planar pattern; and a shielding structure for preventing interference of signals is provided between each two adjacent ones of the sub-pixel regions.

4. The display panel according to claim 1, wherein each of the sub-pixel regions has a same number of sub-pixels.

5. The display panel according to claim 1, wherein each of the sub-pixels of a same color in each of the sub-pixel regions has a same number of driving TFTs.

6. The display panel according to claim 1, wherein the channel region of each driving TFT of the sub-pixels of a same color in the sub-pixel regions along a direction of a same data line has the same width-to-length ratio.

7. The display panel according to claim 1, wherein the channel region of each driving TFT of the sub-pixels of a same color in the sub-pixel regions along a direction of a same scan line has a gradually decreased width and a same length.

8. The display panel according to claim 1, wherein pixel circuits disposed corresponding to each line of the arrayed sub-pixels are sequentially connected in series, and the pixel circuits disposed corresponding to each two adjacent lines of the sub-pixels are connected in parallel.

9. The display panel according to claim 1, wherein the sub-pixels include a switching TFT, the driving TFT, a detecting TFT, a storage capacitor, and an organic light-emitting diode, and a detection voltage connected to the detecting TFT is a constant voltage.

10. The display panel according to claim 1, wherein a scan voltage is applied to each of the sub-pixels of a same row through a same scan signal line; and a data voltage is applied to each of the sub-pixels of a same column through a same data signal line.

11. A display device, comprising:
a display panel, wherein the display panel comprises:
at least three sub-pixel regions, wherein the sub-pixel regions are arranged along a direction of a scan line, the sub-pixel regions comprise a plurality of sub-pixels arranged in an array pattern, and each of the sub-pixels comprises at least one driving thin-film-transistor (TFT); and
wherein a channel region of each driving TFT in the same sub-pixel region has a same width-to-length ratio; and along a direction from a signal input end to a signal output end of the scan line, the width-to-length ratio of the channel region of each driving TFT of any of the sub-pixel regions is smaller than that of a previous one of the sub-pixel regions.

12. The display device according to claim 11, wherein the sub-pixel regions are equidistant along the direction of the scan line and a direction of a data line in the display panel.

13. The display device according to claim 11, wherein each sub-pixel region comprises one or more of a rectangle, a parallelogram, a diamond, a triangle, a polygon, or an irregular planar pattern; and a shielding structure for preventing interference of signals is provided between each two adjacent ones of the sub-pixel regions.

14. The display device according to claim 11, wherein each of the sub-pixel regions has a same number of sub-pixels.

15. The display device according to claim 11, wherein the sub-pixels of a same color in each of the sub-pixel regions has a same number of driving TFTs.

16. The display device according to claim 11, wherein the channel region of each driving TFT of the sub-pixels of a same color in the sub-pixel regions along a direction of a same data line has the same width-to-length ratio.

17. The display device according to claim 11, wherein the channel region of each driving TFT of the sub-pixels of a same color in the sub-pixel regions along a direction of a same scan line has a gradually decreased width and a same length.

18. The display device according to claim 11, wherein pixel circuits disposed corresponding to each line of the arrayed sub-pixels are sequentially connected in series, and the pixel circuits disposed corresponding to each two adjacent lines of the sub-pixels are connected in parallel.

19. The display device according to claim 11, wherein the sub-pixels include a switching TFT, the driving TFT, a detecting TFT, a storage capacitor, and an organic light-emitting diode, and a detection voltage connected to the detecting TFT is a constant voltage.

20. The display panel according to claim 11, wherein a scan voltage is applied to each of the sub-pixels of a same row through a same scan signal line; and a data voltage is applied to each of the sub-pixels of a same column through a same data signal line.

* * * * *